US012791610B2

(12) United States Patent
Kasai et al.

(10) Patent No.: US 12,791,610 B2
(45) Date of Patent: Nov. 10, 2026

(54) INSPECTION APPARATUS

(71) Applicant: TOKYO ELECTRON LIMITED, Tokyo (JP)

(72) Inventors: Shigeru Kasai, Yamanashi (JP); Naoki Akiyama, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 227 days.

(21) Appl. No.: 18/848,035

(22) PCT Filed: Mar. 16, 2023

(86) PCT No.: PCT/JP2023/010418
§ 371 (c)(1),
(2) Date: Sep. 17, 2024

(87) PCT Pub. No.: WO2023/189675
PCT Pub. Date: Oct. 5, 2023

(65) Prior Publication Data

US 2025/0224445 A1 Jul. 10, 2025

(30) Foreign Application Priority Data

Mar. 30, 2022 (JP) ................................ 2022-056384

(51) Int. Cl.
*G01R 31/308* (2006.01)
*G01R 1/073* (2006.01)
*G01R 31/28* (2006.01)

(52) U.S. Cl.
CPC ....... *G01R 31/308* (2013.01); *G01R 1/07342* (2013.01); *G01R 31/2874* (2013.01)

(58) Field of Classification Search
CPC .............. G01R 31/308; G01R 1/07342; G01R 31/2874; G01R 31/2601; G01R 31/2637;
(Continued)

(56) References Cited

U.S. PATENT DOCUMENTS

2017/0213796 A1* 7/2017 Fischer ................. G01N 21/64

FOREIGN PATENT DOCUMENTS

JP 2013121888 A * 6/2013
JP 2016009752 A * 1/2016
(Continued)

*Primary Examiner* — Arleen M Vazquez
*Assistant Examiner* — Robert P Alejnikov, Jr.
(74) *Attorney, Agent, or Firm* — Fenwick & West LLP

(57) ABSTRACT

There is provided an inspection apparatus for inspecting a device to be inspected. The device to be inspected is a back-illuminated imaging device in which light is incident from a back surface opposite to a side on which a wiring layer is provided, and is formed at an inspection object. The inspection apparatus comprises: a placing table. The placing table includes: a ceiling plate made of a light transmitting material and on which the inspection object is placed; a base member made of a light transmitting material, disposed to face the inspection object with the ceiling plate interposed therebetween, and forming a space to be exhausted with respect to the ceiling plate; and a light irradiation mechanism disposed to face the inspection object with the ceiling plate and the base member interposed therebetween, and configured to irradiate light toward the inspection object.

11 Claims, 7 Drawing Sheets

(58) Field of Classification Search
CPC ............. G01R 31/2642; H10P 72/0434; H10P 72/0602; H10P 72/0616; G01N 21/8806; G01N 21/9501
USPC ...................................................... 324/750.03
See application file for complete search history.

(56) References Cited

FOREIGN PATENT DOCUMENTS

| | | | | | | |
|---|---|---|---|---|---|---|
| JP | 2019012757 | A | * | 1/2019 | | |
| JP | 2019-106491 | A | | 6/2019 | | |
| WO | WO-2020085203 | A1 | * | 4/2020 | ............. | H10F 39/12 |

* cited by examiner

10

10A

10C

INSPECTION APPARATUS

TECHNICAL FIELD

The present disclosure relates to an inspection apparatus.

BACKGROUND

The inspection apparatus of Patent Document 1 inspects an imaging device by irradiating light onto the imaging device formed on an inspection object (e.g., wafer) and brining a contact terminal electric contact with a wiring layer of the imaging device. In Patent Document 1, light is incident on the imaging device from a back surface that is opposite to a surface on which the wiring layer is provided. The inspection apparatus of Patent Document 1 includes a placing table formed of a light transmitting member on which the inspection object is placed to face the back surface of the imaging device, and a light irradiation mechanism having a plurality of LEDs that are arranged to face the inspection object with the placing table interposed therebetween and are directed toward the inspection object. Further, in Patent Document 1, the placing table has an upper cover on the side surface of the inspection object and a bottom member on the light irradiation mechanism side, and an attracting hole for attracting the inspection object is formed on the surface of the upper cover. The attracting hole is formed in an area where the imaging device is not located above the attracting hole when the inspection object is placed on the upper cover.

PRIOR ART DOCUMENTS

Patent Documents

Patent document 1: Japanese Laid-open Patent Publication No. 2019-106491

SUMMARY

Problems to be Resolved by the Invention

The technique of the present disclosure allows an inspection object on which imaging devices are formed to be appropriately attracted, and allows light of a desired intensity to be incident on each imaging device in the case of inspecting back-illuminated imaging devices.

Means for Solving the Problems

According to an embodiment of the present disclosure, there is provided an inspection apparatus for inspecting a device to be inspected, wherein the device to be inspected is a back-illuminated imaging device in which light is incident from a back surface opposite to a side on which a wiring layer is provided, and is formed at an inspection object. The inspection apparatus comprises: a placing table that supports the inspection object while facing the back surface of the imaging device, wherein the placing table includes: a ceiling plate made of a light transmitting material and on which the inspection object is placed; a base member made of a light transmitting material, disposed to face the inspection object with the ceiling plate interposed therebetween, and forming a space to be exhausted with respect to the ceiling plate; and a light irradiation mechanism disposed to face the inspection object with the ceiling plate and the base member interposed therebetween, and configured to irradiate light toward the inspection object, wherein the ceiling plate is made of porous glass having an average pore size of 30 nm or less or 10 μm or more.

Effect of the Invention

In accordance with the present disclosure, in the inspection of back-illuminated imaging devices, an inspection object on which imaging devices are formed can be appropriately attracted, and light of a desired intensity can be incident on each imaging device.

DETAILED DESCRIPTION

Figure 1:
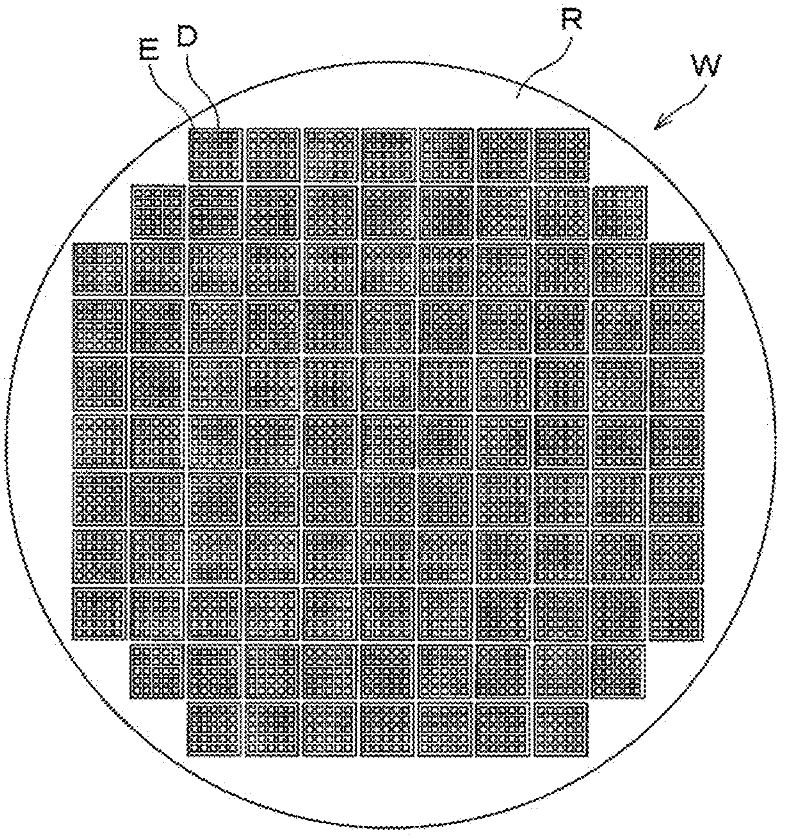
FIG. 1 is a plan view schematically showing a configuration of a substrate as an inspection object on which back-illuminated imaging devices are formed.

In a semiconductor manufacturing process, a plurality of semiconductor devices having a predetermined circuit pattern are formed on a substrate such as a semiconductor wafer (hereinafter, referred to as "wafer"). The electrical characteristics of the formed semiconductor devices are inspected to classify them into non-defective products and defective products. For example, the semiconductor devices are inspected using an inspection apparatus referred to as "prober" or the like before the plurality of semiconductor devices on a substrate are divided into individual devices.

In the inspection apparatus, a probe card having a plurality of probes that are needle-shaped contact terminals are disposed above a placing table on which the substrate is placed. During inspection, the probe card and the wafer on the placing table become close to each other, and the probes of the probe card are brought into contact with electrodes of the semiconductor devices formed on the substrate. In that state, an electrical signal is supplied from a test head disposed above the probe card to the semiconductor devices through the probes. Then, based on the electrical signal received by the test head from the semiconductor devices through the probes, the corresponding semiconductor devices are classified into defective products or non-defective products.

When the semiconductor device to be inspected is an imaging device such as a CMOS sensor, the inspection is performed while illuminating the imaging device with light, unlike the case of other general semiconductor devices.

Recently, a back-illuminated imaging device for receiving light incident from a back side opposite to a front side on which a wiring layer is formed has been developed. Patent Document 1 discloses an inspection apparatus for a backside illuminated imaging device.

The inspection apparatus of Patent Document 1 includes a placing table formed of a light transmitting member on which a substrate as an inspection object is placed to face a back surface of a back-illuminated imaging device, and a light irradiation mechanism having a plurality of LEDs that are arranged to face the inspection object with the placing table interposed therebetween and are directed toward the inspection object. Further, in the inspection apparatus of Patent Document 1, the placing table has an upper cover on the side surface of the inspection object and a bottom member on the light irradiation mechanism side. An attracting hole for attracting the inspection object is formed on the surface of the upper cover, and is formed in an area where the back-illuminated imaging device is not located above the attracting hole when the inspection object is placed on the upper cover.

However, if the attracting hole is formed only in the area disclosed in Patent Document 1, the attracting force of the inspection object may be insufficient. For example, when a large number of probes are brought into contact with the back-illuminated imaging devices at one time, at least some of the probes are brought into contact with the back surface of the inspection object in an oblique direction. Therefore, although a horizontal force acts from the probes on the inspection object, the inspection object moves due to the horizontal force if the attracting force is insufficient as described above. If the inspection object moves during the inspection, the inspection cannot be performed accurately, or the imaging device as an inspection object may be damaged.

Further, if attracting holes are simply formed in an area overlapping the back-illuminated imaging device in plan view in order to ensure the attracting force of the inspection object, the intensity of light incident on the imaging device varies, which makes it difficult to obtain a desired intensity.

Hence, the technique of the present disclosure provides an inspection apparatus capable of appropriately attracting an inspection object on which imaging devices are formed and allowing light of a desired intensity to be incident on the imaging devices in the case of inspecting a back-illuminated imaging device.

Hereinafter, the inspection apparatus of the present embodiment will be described with reference to the accompanying drawings. Like reference numerals will be used for like parts having substantially the same functions and configurations throughout the specification and the drawings, and redundant description thereof will be omitted.

In the technique according to the present embodiment, the device to be inspected is a back-illuminated imaging device, so the back-illuminated imaging device will be described first.

Figure 2:
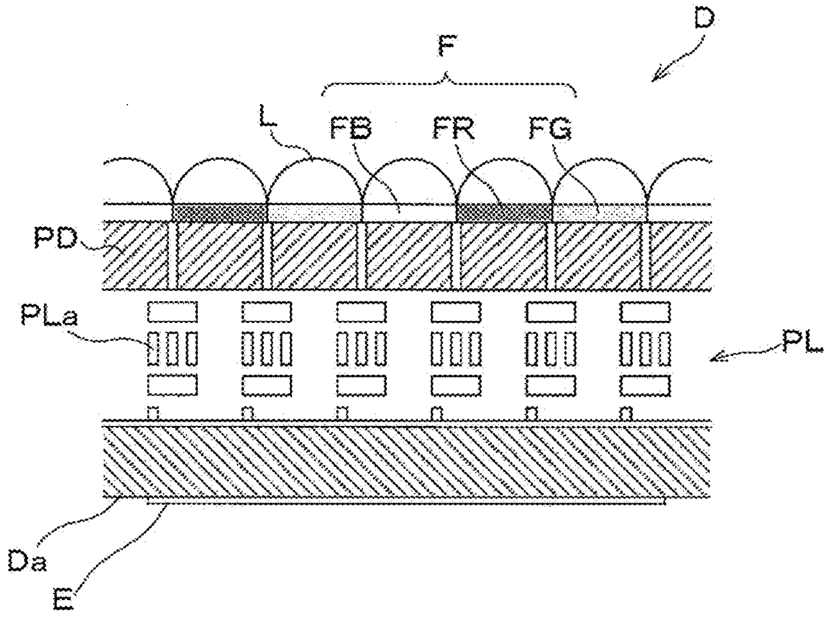
FIG. 2 is a cross-sectional view schematically showing a configuration of the back-illuminated imaging device.

FIG. 1 is a plan view schematically showing a configuration of a substrate as an inspection object on which back-illuminated imaging devices are formed, and FIG. 2 is a cross-sectional view schematically showing a configuration of the back-illuminated imaging device.

As shown in FIG. 1, a plurality of back-illuminated imaging devices D are formed on a substantially disc-shaped wafer W that is an example of a substrate.

The back-illuminated imaging device D is a solid-state imaging element, and has a photoelectric conversion part PD that is a photodiode, and a wiring layer PL including a plurality of wirings PLa, as shown in FIG. 2. Light is incident on the back-illuminated imaging device D from the backside of the wafer W, which is the surface opposite to the front surface on which the wiring layer PL is provided. The back-illuminated imaging device D receives light incident from the backside of the wafer W at the photoelectric conversion part PD through on-chip lenses L and a color filter F. The color filter F includes a red color filter FR, a blue color filter FB, and a green color filter FG.

Electrodes E are formed on a front (top) surface Da of the back-illuminated imaging device D, i.e., the front (top) surface of the wafer W, and the electrodes E are electrically connected to the wirings PLa of the wiring layer PL. The wiring PLa is used for inputting an electric signal into a circuit element of the back-illuminated imaging device D or outputting an electric signal from the circuit element to the outside of the back-illuminated imaging device D. The wiring layer PL may include a pixel transistor for controlling a signal related to the photoelectric conversion part.

As shown in FIG. 1, a non-device formation region R where the back-illuminated imaging devices D are not formed exists on an outer periphery of the wafer W.

First Embodiment

[Inspection Apparatus]

Next, the inspection apparatus according to the first embodiment will be described.

Figure 3:
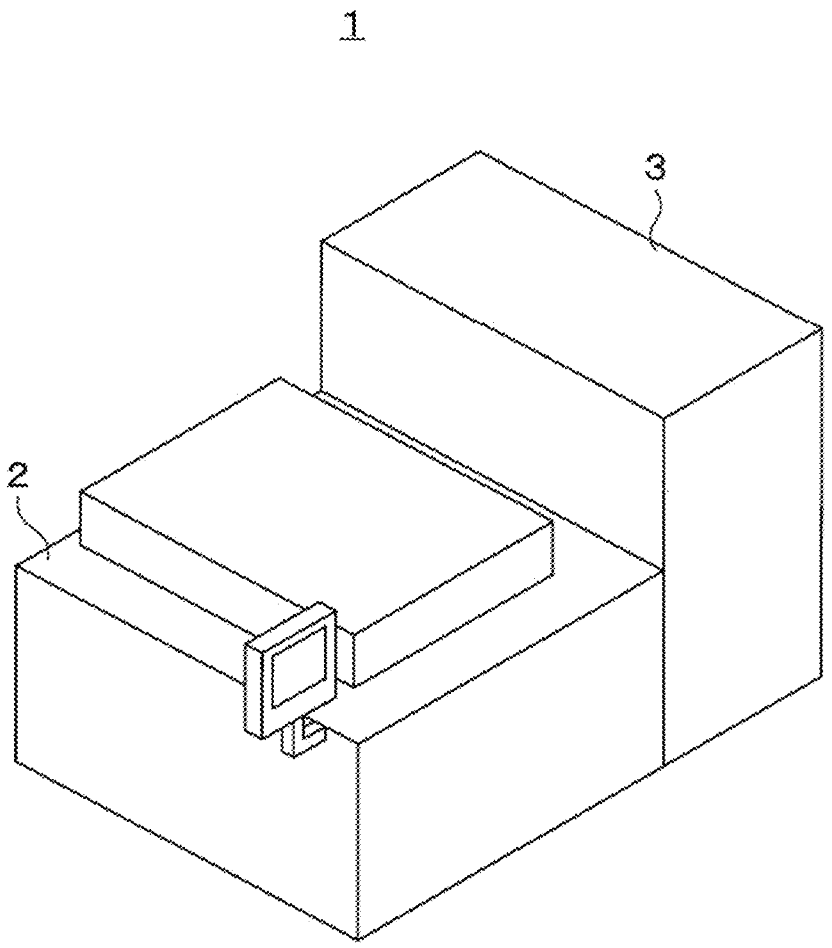
FIG. 3 is a perspective view schematically showing a configuration of a prober as an inspection apparatus according to a first embodiment.
Figure 4:
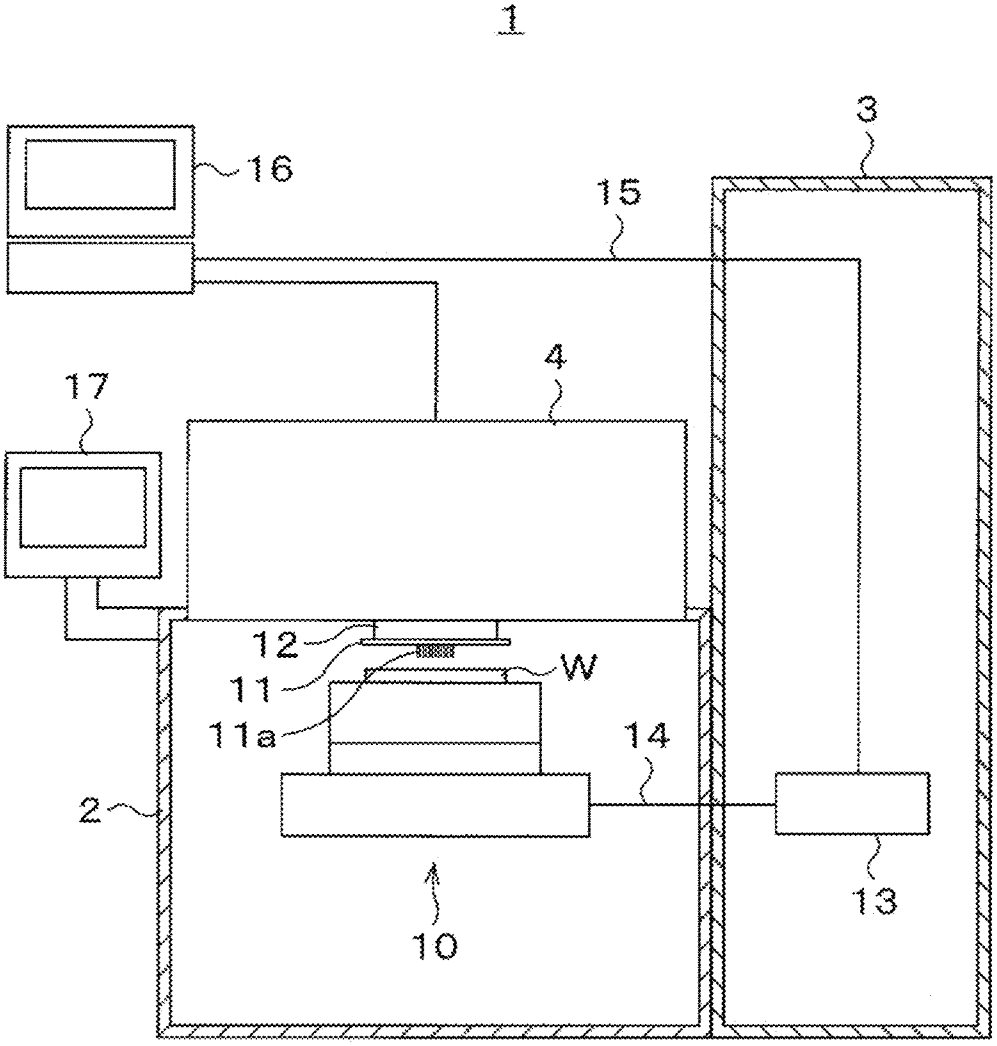
FIG. 4 is front view schematically showing a configuration of a prober as an inspection apparatus according to a first embodiment.

FIG. 3 and FIG. 4 are respectively a perspective view and a front view showing a schematic configuration of a prober 1 as an inspection apparatus according to the first embodiment. FIG. 4 shows a cross section of a part of the prober 1 shown in FIG. 3 to illustrate components accommodated in a loader and an accommodation chamber to be described later.

The prober 1 inspects electrical characteristics of each of the plurality of back-illuminated imaging devices D (hereinafter, may be simply referred to as "imaging devices D") formed on the wafer W. As shown in FIGS. 3 and 4, the prober 1 includes an accommodation chamber 2, a loader 3 disposed adjacent to the accommodation chamber 2, and a tester 4 disposed to cover the accommodation chamber 2.

The accommodation chamber 2 is a hollow housing, and has therein a stage 10 serving as a placing table. As will be described later, the stage 10 supports the wafer W such that the back surfaces of the imaging devices D face the stage 10.

The stage 10 is configured to be movable in horizontal and vertical directions, and the relative positions of the probe card 11 (to be described later) and the wafer W can be adjusted to bring the electrodes E on the surface of the wafer W into contact with the probes 11*a* (to be described later) of the probe card 11.

The probe card 11 is disposed above the stage 10 in the accommodation chamber 2 to face the stage 10. The probe card 11 has a plurality of needle-shaped probes 11*a* as contact terminals. Each probe 11*a* is formed to be in contact with a corresponding electrode E on the surface of the wafer W.

The probe card 11 is connected to the tester 4 via an interface 12. During the inspection of the imaging device D, each probe 11*a* is brought into contact with the corresponding electrode E and supplies a power inputted from the tester 4 via the interface 12 to the imaging device D, or transmits a signal from the imaging device D to the tester 4 via the interface 12.

The loader 3 takes out the wafer W accommodated in a front opening unified pod (FOUP) (not shown) that is a transfer container, and transfers it to the stage 10 of the storage chamber 2. Further, the loader 3 receives the wafer W having the imaging devices D subjected to the electrical characteristic inspection from the stage 10 and stores it in the FOUP.

The loader 3 has a base unit 13 as a controller for controlling power supply or the like. The base unit 13 is a computer including a processor such as a central processing unit (CPU), a memory, or the like, and has a program storage. The program storage stores a program for controlling operations of individual components of the prober 1 during the electrical characteristic inspection. The program may be recorded in a computer-readable storage medium, and may be installed in the base unit 13 from the storage medium.

The base unit 13 is connected to the stage 10 via a wiring 14, and is connected to a tester computer 16 via a wiring 15. The base unit 13 controls the irradiation operation of the light irradiation mechanism (to be described later) of the stage 10 based on an input signal from the tester computer 16. The base unit 13 also controls a temperature control mechanism 60 (to be described later) of the stage 10. The base unit 13 may be provided in the accommodation chamber 2.

The tester 4 has a test board (not shown) that reproduces a part of a circuit configuration of a motherboard on which the imaging devices D are mounted. The test board is connected to the tester computer 16. The tester computer 16 determines whether the imaging device D is defective or non-defective based on a signal from the imaging device D. The tester 4 can reproduce the circuit configuration of multiple types of motherboards by replacing the test board.

The prober 1 further includes a user interface 17. The user interface 17 is used for displaying information to a user and inputting instructions. The user interface 17 is, e.g., a display panel having a touch panel or a keyboard.

In the prober 1 having the above-described components, in the case of testing the electrical characteristics of the imaging device D, the tester computer 16 transmits data to the test board connected to the imaging device D via the probes 11*a*. Then, the tester computer 16 determines whether or not the transmitted data has been correctly processed by the test board based on the electrical signal from the test board.

[Stage]

Figure 5:
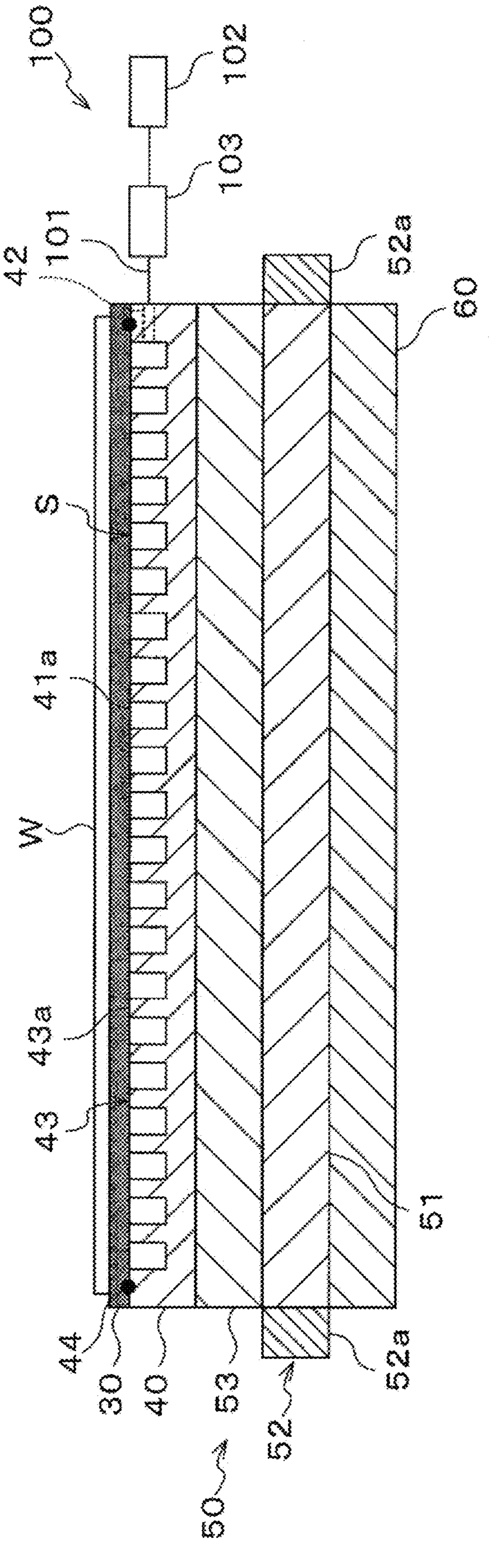
FIG. 5 is a cross-sectional view schematically showing a configuration of a stage.

Next, the configuration of the stage 10 will be described. FIG. 5 is a cross-sectional view schematically showing a configuration of the stage 10.

The wafer W is placed on the stage 10 such that with the back surface of the imaging device D facing the stage 10. As shown in FIG. 5, the stage 10 has a ceiling plate 30, a base member 40, and a light irradiation mechanism 50.

The ceiling plate 30 is made of a light transmitting material, places the wafer W thereon, and is formed in a flat plate shape (specifically, a disc shape having a diameter greater than the diameter of the wafer W).

In the present embodiment, the ceiling plate 30 is made of light transmitting porous glass having an average pore diameter of 30 nm or less. Specifically, the porous glass used for the ceiling plate 30 is porous glass obtained as follows. In other words, first, raw glass (e.g., $Na_2O$—$B_2O_3$—$SiO_2$ glass) is melted, and then phase-separated by heat treatment or the like, so that a mesh made of another phase ($Na_2O$—$B_2O_3$ glass) is formed in a flat plate made of one phase ($SiO_2$ glass). Then, only the mesh is removed by acid treatment or the like, so that porous glass in which a plurality of holes penetrate through a flat plate made of the one phase ($SiO_2$ glass) nonlinearly in a thickness direction is obtained. This porous glass is used for the ceiling plate 30.

Since the ceiling plate 30 is made of the porous glass described above, holes penetrating through the ceiling plate 30 nonlinearly in the thickness direction are formed not only in the area that does not overlap the imaging devices D but also in the area overlapping the imaging devices D in plan view when the wafer W is placed on the ceiling plate 30. In other words, the holes penetrating through the ceiling plate 30 nonlinearly in the thickness direction are formed in the entire surface of the ceiling plate 30.

The above-described "light transmitting material" is a material that transmits light of a wavelength in an inspection range (i.e., light from the light irradiation mechanism 50). Similarly, "light transmitting property" is the property of transmitting light of the wavelength in the inspection range.

The base member 40 is made of a light transmitting material, is disposed to face the wafer W with the ceiling plate 30 interposed therebetween, and forms a space S to be exhausted between itself and the ceiling plate 30. Specifically, the light transmitting material used for the base member 40 is glass having a thermal expansion coefficient that is approximately the same as that of the wafer W.

In one embodiment, the base member 40 has a recess 41*a* that is recessed toward the side opposite to the ceiling plate 30 side, and the space S is formed by blocking the opening of the recess 41*a* by the ceiling plate 30. The space S is exhausted by an exhaust mechanism 100.

The exhaust mechanism 100 is controlled by the base unit 13, and has an exhaust line 101 in addition to a vacuum exhaust pump 102. One end of the exhaust line 101 is connected to the space S via a connection hole 42, and the other end is connected to the vacuum exhaust pump 102. A buffer tank 103 is interposed in the exhaust line 101. The exhaust line 101 must be designed to have a low conductance so that the buffer tank 103 becomes substantially the same space.

Further, a support portion 43 that extends from the bottom portion of the recess 41*a* toward the ceiling plate 30 and supports the ceiling plate 30 is disposed in the recess 41*a*. The support portion 43 has a plurality of support columns 43*a* formed in a columnar shape and extending toward the ceiling plate 30, for example. The support portion 43 may have a support wall formed in a spiral shape in plan view, instead of the support columns 43*a*. The support portion 43 may have both the support columns 43*a* and the spiral-shaped support wall.

In order to make the space S airtight, an O-ring 44 is disposed between the ceiling plate 30 and the base member 40, for example. Specifically, the O-ring 44 is disposed between the peripheral portion of the ceiling plate 30 and the peripheral portion of the base member 40. The ceiling plate 30 and the base member 40 may be bonded by an adhesive.

The light irradiation mechanism 50 is disposed to face the wafer W with the ceiling plate 30 and the base member 40 interposed therebetween, and irradiates light toward the wafer W.

The light irradiation mechanism 50 has, e.g., a light guide plate 51, a light source 52, and a diffusion plate 53.

The light guide plate 51 is disposed to face the base member 40 and is formed in a flat plate shape (specifically, a disc shape having a diameter greater than the diameter of the wafer W). The light guide plate 51 emits light incident from the circumferential end surface thereof toward the base member 40, i.e., toward the wafer W.

The light source 52 emits light for inspection, and has a plurality of LED units 52*a* having LEDs. The light source 52 is disposed at the lateral side of the light guide plate 51. Specifically, the light source 52 has the plurality of LED units 52*a* disposed along the circumferential end surface of the light guide plate 51. Each LED unit 52*a* emits light with a wavelength of the inspection range toward the center of the light guide plate 51. The light with a wavelength of the inspection range is, e.g., light with a wavelength of a visible light region.

The diffusion plate 53 diffuses the light from the light source 52. In the present embodiment, the diffusion plate 53 diffuses the light emitted from the light guide plate 51 and makes it incident on the base member 40.

Further, the light irradiation mechanism 50 may have a heat sink that releases heat from the LED unit 52*a*.

Further, the stage 10 has a temperature control mechanism 60 for controlling the temperature of the wafer W. A placing table (hereinafter, referred to as "temperature control stage") for a wafer W, which has a conventional temperature control function, can be used as the temperature control mechanism. The conventional temperature control stage has an attracting mechanism for the wafer W, so that the light irradiation mechanism 50 (specifically, the light guide plate 51) is attracted and held by the attracting mechanism. Further, the light guide plate 51 and the light source 52, the light guide plate 51 and the diffusion plate 53, and the diffusion plate 53 and the base member 40 are fixed by adhesive bonding using a transparent adhesive material, for example.

[Inspection Process]

Next, an example of an inspection process for a wafer W using the prober 1 will be described. In the following description, one imaging device D is inspected in one inspection process. However, multiple imaging devices D may be inspected at once in one inspection process using the prober 1.

For example, first, the wafer W is taken out of the FOUP of the loader 3 and transferred into the accommodation chamber 2. Then, the wafer W is placed on the ceiling plate 30 of the stage 10 such that the back surfaces of the imaging devices D formed on the wafer W face the stage 10 and the wafer W is brought into contact with the surface of the ceiling plate 30 of the stage 10 that is opposite to the base member 40. Then, the space S between the ceiling plate 30 and the base member 40 is exhausted by the exhaust mechanism 100. Since the ceiling plate 30 is made of porous glass, the space between the backside of the wafer W and the ceiling plate 30 is exhausted through the holes of the porous glass of the ceiling plate 30 by exhausting the space S as described above, and the wafer W is attracted and held by the ceiling plate 30. Further, since the exhaust mechanism 100 has the buffer tank 103, the exhaust flow rate through the connection hole 42 can be reduced, and the increase in the attracting force of the wafer W only in the vicinity of the connection hole 42 can be suppressed.

Then, the stage 10 is moved, and the probes 11*a* disposed above the stage 10 are brought into contact with the electrodes E of the imaging device D to be inspected.

Then, light is irradiated from the light irradiation mechanism 50. Specifically, all the LED units 52*a* of the light source 52 are turned on. Accordingly, light is incident on the circumferential end surface of the light guide plate 51 from each LED unit 52*a*. The light incident on the light guide plate 51 is reflected and diffused in the light guide plate 51 toward the base member 40, and is emitted in a planar shape from the surface of the light guide plate 51 that faces the wafer W.

The light emitted from the light guide plate 51 is diffused by the diffusion plate 53, and then is incident on the wafer W through the base member 40 and the ceiling plate 30 that are light transmitting members.

Unlike the present embodiment, if the diameter of the hole penetrating through the ceiling plate 30 non-linearly is the same as the wavelength of the light irradiated from the light irradiation mechanism 50, the light is refracted or reflected by the hole and, thus, the light incident on the wafer W through the ceiling plate 30 is locally intensified or weakened. In this case, the light irradiated from the light irradiation mechanism 50 may not be incident with a desired intensity on a desired portion of the wafer W (specifically, portion corresponding to the imaging device D to be inspected). On the other hand, in the present embodiment, the diameter (average hole diameter) of the hole penetrating through the ceiling plate 30 non-linearly is 30 nm or less, which is sufficiently small compared to the wavelength of the light irradiated from the light irradiation mechanism 50, so that the existence of the hole is substantially ignored. Therefore, in the present embodiment, the light is not refracted or reflected by the hole. Accordingly, in accordance with the present embodiment, if the light incident on the ceiling plate 30 is not deflected in the plane, the light incident on the wafer W through the ceiling plate 30 is not deflected in the plane. Hence, in the present embodiment, the light irradiated from the light irradiation mechanism 50 can be incident with a desired intensity on a desired portion (specifically, portion corresponding to the imaging device D to be inspected) on the wafer W.

When the light is irradiated from the light irradiation mechanism 50 described above, an inspection signal is inputted to the probes 11*a*. Accordingly, the imaging devices D are inspected. During the inspection, the temperature of the wafer W is measured by a temperature measurement part (not shown), for example. Based on the result, and the temperature control mechanism 60 is controlled, and the temperature of the wafer W is adjusted to a desired value based, thereby adjusting the temperature of the imaging devices D to a desired value.

Thereafter, the above-described processes are repeated until the inspection of all the imaging devices D is completed.

[Main Effects of Present Embodiment]

As described above, in the present embodiment, the ceiling plate 30 is made of porous glass, and holes for attracting the wafer W are formed in the entire surface of the ceiling plate 30 that includes the area overlapping the imaging devices D in plan view. Therefore, even if the exhaust flow rate from the space S between the ceiling plate 30 and the base member 40 is low, the wafer W can be attracted to the ceiling plate 30 with a vacuum attracting force higher than that in the conventional case.

Further, in the present embodiment, the diameter (average hole diameter) of the holes in the ceiling plate 30 is 30 nm or less, so that the light irradiated from the light irradiation mechanism 50 can be incident with a desired intensity on the portion of the wafer W corresponding to the imaging device D to be inspected, as described above.

In other words, in accordance with the present embodiment, in the inspection of the back-illuminated imaging device D, the wafer W can be appropriately attracted, and light of a desired intensity can be incident on the back-illuminated imaging device D to be inspected.

Second Embodiment

[Stage]

Figure 6:
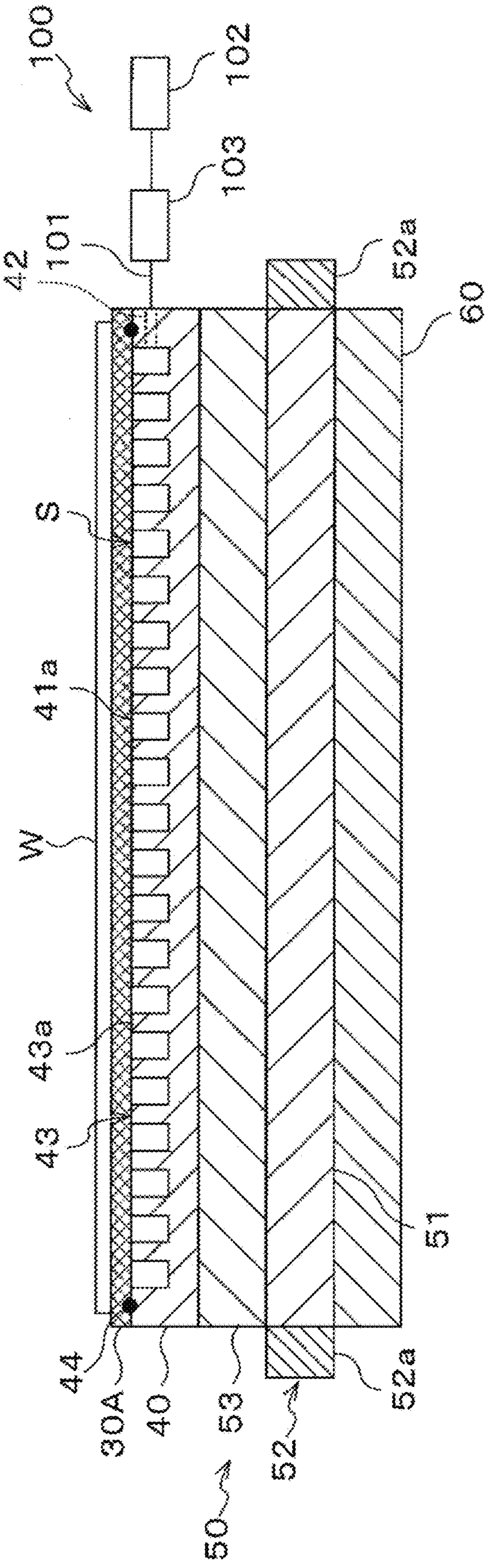
FIG. 6 is a cross-sectional view schematically showing a configuration of a stage according to a second embodiment.

Next, a stage according to a second embodiment will be described. FIG. 6 is a cross-sectional view schematically showing a configuration of the stage according to the second embodiment.

In the stage 10 of FIG. 5, the ceiling plate 30 is made of light transmitting porous glass having an average pore size of 30 nm or less. On the other hand, in a stage 10A of FIG. 6, a ceiling plate 30A is made of light transmitting porous glass having an average pore size of 10 μm or more. The porous glass used for the ceiling plate 30A can be obtained in the same manner as the porous glass used for the ceiling plate 30 of FIG. 5.

Similarly to the ceiling plate 30 of FIG. 5, the ceiling plate 30A has holes penetrating through the ceiling plate 30A nonlinearly in the thickness direction not only in the area that does not overlap the imaging devices D but also in the area that overlaps the imaging devices D in plan view in a state where the wafer W is placed on the ceiling plate 30A. In other words, the holes penetrating through the ceiling plate 30A nonlinearly in the thickness direction are formed in the entire surface of the ceiling plate 30A.

[Main Effects of Present Embodiment]

In the present embodiment, similarly to the first embodiment, the ceiling plate 30A is made of porous glass, and holes for attracting the wafer W are formed in the entire surface of the ceiling plate 30A that includes the area overlapping the imaging devices D in plan view. Therefore, even if the exhaust flow rate from the space S between the ceiling plate 30A and the base member 40 is low, the wafer W can be attracted to the ceiling plate 30 with a vacuum attracting force higher than that in the conventional case.

Further, in the present embodiment, the diameter (average hole diameter) of the holes penetrating through the ceiling plate 30A non-linearly is 10 μm or more, which is sufficiently greater than the wavelength of the light irradiated from the light irradiation mechanism 50 and incident on the ceiling plate 30A. In addition, the holes have various shapes. Therefore, even if the light incident on the ceiling plate 30A is refracted or reflected by the holes, the light incident on the wafer W through the ceiling plate 30A is not regularly intensified or weakened. In the present embodiment, the light incident on the ceiling plate 30A is diffused by the ceiling plate 30A and incident on the wafer W. Hence, in accordance with the present embodiment, if the light incident on the ceiling plate 30A is not deflected in the plane, the light incident on the wafer W through the ceiling plate 30A is not deflected in the plane, and the light incident on the wafer W through the ceiling plate 30A becomes more uniform in the plane compared to the light incident on the ceiling plate 30A. Accordingly, also in the present embodiment, the light irradiated from the light irradiation mechanism 50 can be incident with a desired intensity on a desired portion (specifically, portion corresponding to the imaging device D to be inspected) of the wafer W.

In other words, also in the present embodiment, in the inspection of the back-illuminated imaging device D, the wafer W can be appropriately attracted, and light of a desired intensity can be incident on the back-illuminated imaging device D to be inspected.

(Modification)

In the case of using the stage 10A according to the second embodiment, the light incident on the wafer W is diffused by the ceiling plate 30A, so that the light irradiation mechanism 50 may not have the diffusion plate 53.

Also in the case of using the stage 10 according to the first embodiment, if the ceiling plate 30 is precisely designed, the refraction and reflection of light can be appropriately utilized, which makes it possible to omit the diffusion plate 53.

Figure 7:
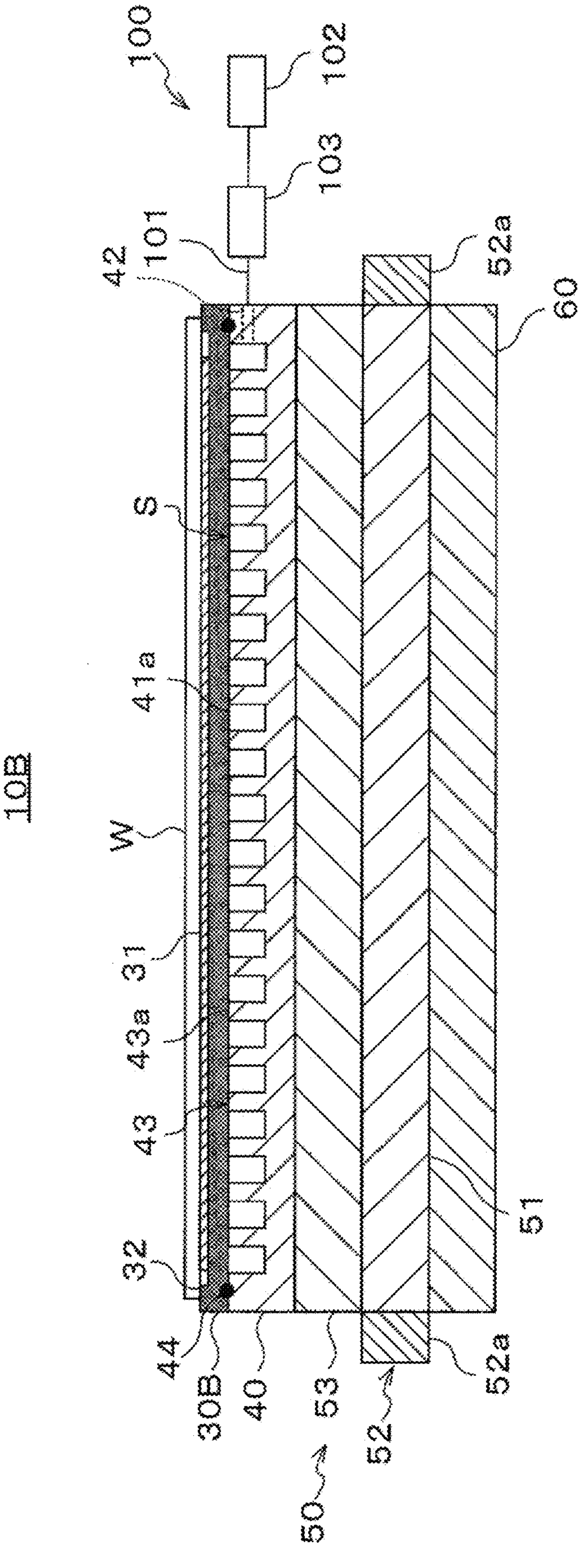
FIG. 7 shows a modification of the stage according to the first embodiment.

FIG. 7 shows a modification of the stage according to the first embodiment.

In a stage 10B shown in FIG. 7, the surface of the ceiling plate 30B made of porous glass with a pore diameter of 30 nm or less, which faces the wafer W, is coated with silicon. Specifically, the surface of the ceiling plate 30B of the stage 10B that faces the wafer W is coated with silicon in a state where holes not blocked.

The following is description of a method for manufacturing the ceiling plate 30B coated with silicon in a state where the holes are not blocked. In other words, after the entire surface of the porous glass is coated with silicon, a gas is sprayed, before the silicon solidifies, toward the back surface to blow away a portion of silicon covering the entire surface of the porous glass that overlaps the holes of the ceiling plate 30B. Accordingly, it is possible to manufacture the ceiling plate 30B coated with silicon in a state where the holes are not blocked.

In this example, when the wafer W is attracted and held on the stage 10B (specifically, the ceiling plate 30B) through the holes of the porous glass forming the ceiling plate 30B, the silicon coating layer 31 is actually brought into contact with the ceiling plate 30B in a state where the backside (specifically, the on-chip lenses L) of the wafer W are brought into contact with the ceiling plate 30B. Therefore, it is possible to suppress the backside (specifically, the on-chip lenses L) of the wafer W from being damaged by the contact with the ceiling plate 30B.

The ceiling plate 30B has an annular wall 32 having an annular shape in plan view and is formed along the ceiling plate 30B to support the peripheral portion of the wafer W.

The annular wall 32 may be disposed on the stage 10 of FIG. 5, which does not have the silicon coating layer 31.

The silicon coating layer 31 and the annular wall 32 may be disposed at the ceiling plate 30A of the stage 10A of FIG. 6.

Figure 8:
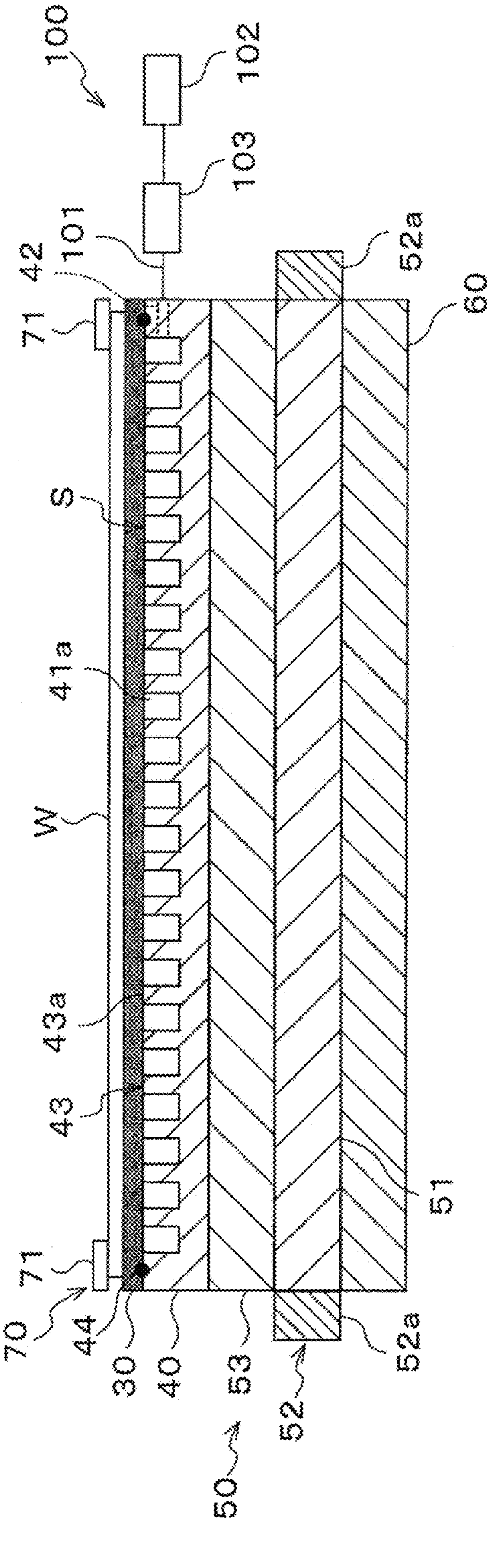
FIG. 8 shows another modification of the stage according to the first embodiment.

FIG. 8 shows another modification of the stage according to the first embodiment.

The stage 10C of FIG. 8 further includes a clamping mechanism 70 for clamping the wafer W between itself and the ceiling plate 30. Specifically, the clamping mechanism 70 clamps the non-device formation region R of the outer periphery of the wafer W between itself and the ceiling plate 30.

The clamping mechanism 70 includes a plate-shaped member 71 configured to be raised and lowered and a lifting mechanism (not shown) for lifting and lowering the plate-shaped member 71, for example. The lifting mechanism includes a driving source such as a motor that outputs a driving force for lifting and lowering the plate-shaped member 71, and is controlled by the base unit 13.

By using the stage 10C, when the wafer W is attracted and held through the holes of the ceiling plate 30, the wafer W can also be clamped by the clamping mechanism 70, which makes it possible to further suppress the movement of the wafer W.

The clamping mechanism 70 may be disposed at the stage 10A shown in FIG. 6.

In the above example, the temperature control mechanism 60 is disposed on the side of the light irradiation mechanism 50 that is opposite to the base member 40 side. The temperature control mechanism for the wafer W may be disposed between the light irradiation mechanism 50 and the base member 40. In this case, the temperature control mechanism is made of a light transmitting material.

It should be noted that the embodiments of the present disclosure are illustrative in all respects and are not restrictive. The above-described embodiments may be omitted, replaced, or changed in various forms without departing from the scope of the appended claims and the gist thereof.

DESCRIPTION OF REFERENCE NUMERALS

1: Prober
10, 10A, 10B, 10C: stage
30, 30A, 30B: ceiling plate
40: base member
50: light irradiation mechanism
51: light guide plate
D: back-illuminated imaging device
PL: wiring layer
S: space
W: wafer

The invention claimed is:

1. An inspection apparatus for inspecting a device to be inspected, wherein the device to be inspected is a back-illuminated imaging device in which light is incident from a back surface opposite to a side on which a wiring layer is provided, and is formed at an inspection object, the inspection apparatus comprising:
- a placing table that supports the inspection object while facing the back surface of the imaging apparatus,
- wherein the placing table includes:
- a ceiling plate made of a light transmitting material and on which the inspection object is placed;
- a base member made of a light transmitting material, disposed to face the inspection object with the ceiling plate interposed therebetween, and forming a space to be exhausted with respect to the ceiling plate; and
- a light irradiation mechanism disposed to face the inspection object with the ceiling plate and the base member interposed therebetween, and configured to irradiate light toward the inspection object,
- wherein the ceiling plate is made of porous glass having an average pore size of 30 nm or less or 10 μm or more, and
- wherein the light irradiation mechanism includes a light source and a diffusion plate configured to diffuse light from the light source.

2. The inspection apparatus of claim 1, wherein the light irradiation mechanism further has a light guide plate disposed to face the base member,
- the light guide plate is configured to guide light from the light source disposed at a lateral side of the light guide plate to the inspection object, and
- the diffusion plate is disposed between the base member and the light guide plate.

3. The inspection apparatus of claim 2, wherein a surface of the ceiling plate that faces the inspection object is covered with silicon.

4. The inspection apparatus of claim 2, further comprising:
- a clamping mechanism configured to clamp the inspection object against the ceiling plate.

5. The inspection apparatus of claim 2, further comprising:
- a temperature control mechanism configured to control a temperature of the inspection object.

6. The inspection apparatus of claim 1, wherein a surface of the ceiling plate that faces the inspection object is covered with silicon.

7. The inspection apparatus of claim 1, further comprising:
- a clamping mechanism configured to clamp the inspection object against the ceiling plate.

8. The inspection apparatus of claim 1, further comprising:
- a temperature control mechanism configured to control a temperature of the inspection object.

9. An inspection apparatus for inspecting a device to be inspected, wherein the device to be inspected is a back-illuminated imaging device in which light is incident from a back surface opposite to a side on which a wiring layer is provided, and is formed at an inspection object, the inspection apparatus comprising:
- a placing table that supports the inspection object while facing the back surface of the imaging apparatus,
- wherein the placing table includes:
- a ceiling plate made of a light transmitting material and on which the inspection object is placed;
- a base member made of a light transmitting material, disposed to face the inspection object with the ceiling plate interposed therebetween, and forming a space to be exhausted with respect to the ceiling plate; and
- a light irradiation mechanism disposed to face the inspection object with the ceiling plate and the base member interposed therebetween, and configured to irradiate light toward the inspection object,
- wherein the ceiling plate is made of porous glass having an average pore size of 30 nm or less or 10 μm or more, and
- wherein a surface of the ceiling plate that faces the inspection object is covered with silicon.

10. The inspection apparatus of claim 9, further comprising:
- a clamping mechanism configured to clamp the inspection object against the ceiling plate.

11. The inspection apparatus of claim 9, further comprising:
- a temperature control mechanism configured to control a temperature of the inspection object.

* * * * *